United States Patent [19]

Hoffmann

[11] Patent Number: 5,541,502
[45] Date of Patent: Jul. 30, 1996

[54] LEVEL MEASURING SET FOR LOW-FREQUENCY SIGNALS

[75] Inventor: Klaus Hoffmann, Munich, Germany

[73] Assignee: Siemens Aktiengesellschaft, München, Germany

[21] Appl. No.: 381,970

[22] PCT Filed: Aug. 9, 1993

[86] PCT No.: PCT/DE93/00723

§ 371 Date: Feb. 13, 1995

§ 102(e) Date: Feb. 13, 1995

[87] PCT Pub. No.: WO94/04931

PCT Pub. Date: Mar. 3, 1994

[30] Foreign Application Priority Data

Aug. 17, 1992 [DE] Germany ............... 42 27 166.5

[51] Int. Cl.⁶ .................................................. G01R 19/30
[52] U.S. Cl. .................. 324/103 P; 324/102; 324/119; 327/58; 363/126
[58] Field of Search ............... 324/103 P, 102, 324/119, 111; 327/58, 60, 62; 363/126, 127

[56] References Cited

U.S. PATENT DOCUMENTS 3,225,213  12/1965  Hinrichs et al. ..................... 327/58
3,794,915  2/1974  Wolfinger ............................. 324/111
4,030,016  6/1977  Mariott ................................. 363/126
4,187,537  2/1980  Avicola et al. ...................... 363/127
5,003,196  3/1991  Kawaguchi .......................... 327/62

FOREIGN PATENT DOCUMENTS 1791225  8/1971  Germany.
3831678  3/1990  Germany.
3924049  1/1991  Germany.

*Primary Examiner*—Kenneth A. Wieder
*Assistant Examiner*—Kourosh Cyrus Khosravi
*Attorney, Agent, or Firm*—Kenyon & Kenyon

[57] ABSTRACT

A level measuring set for low-frequency signals with superimposed direct voltage includes a low-pass filter, a measuring rectifier, and a subtractor. A low-frequency measurement signal is supplied to the low-pass filter, which outputs a reference potential ($U_B$) which corresponds to the direct voltage. The reference potential ($U_B$) is applied to a reference point of the measuring rectifier. The measuring rectifier forms a positive and a negative direct voltage component ($+U_M$, $-U_M$) superimposed on the reference potential ($U_B$) for the positive and negative half-waves of the low-frequency signal, respectively. The subtractor receives at inputs thereof the positive and negative direct voltage components ($+U_M$, $-U_M$) superimposed by the reference potential ($U_B$) and emits a level measurement value of the low-frequency measurement signal.

7 Claims, 1 Drawing Sheet

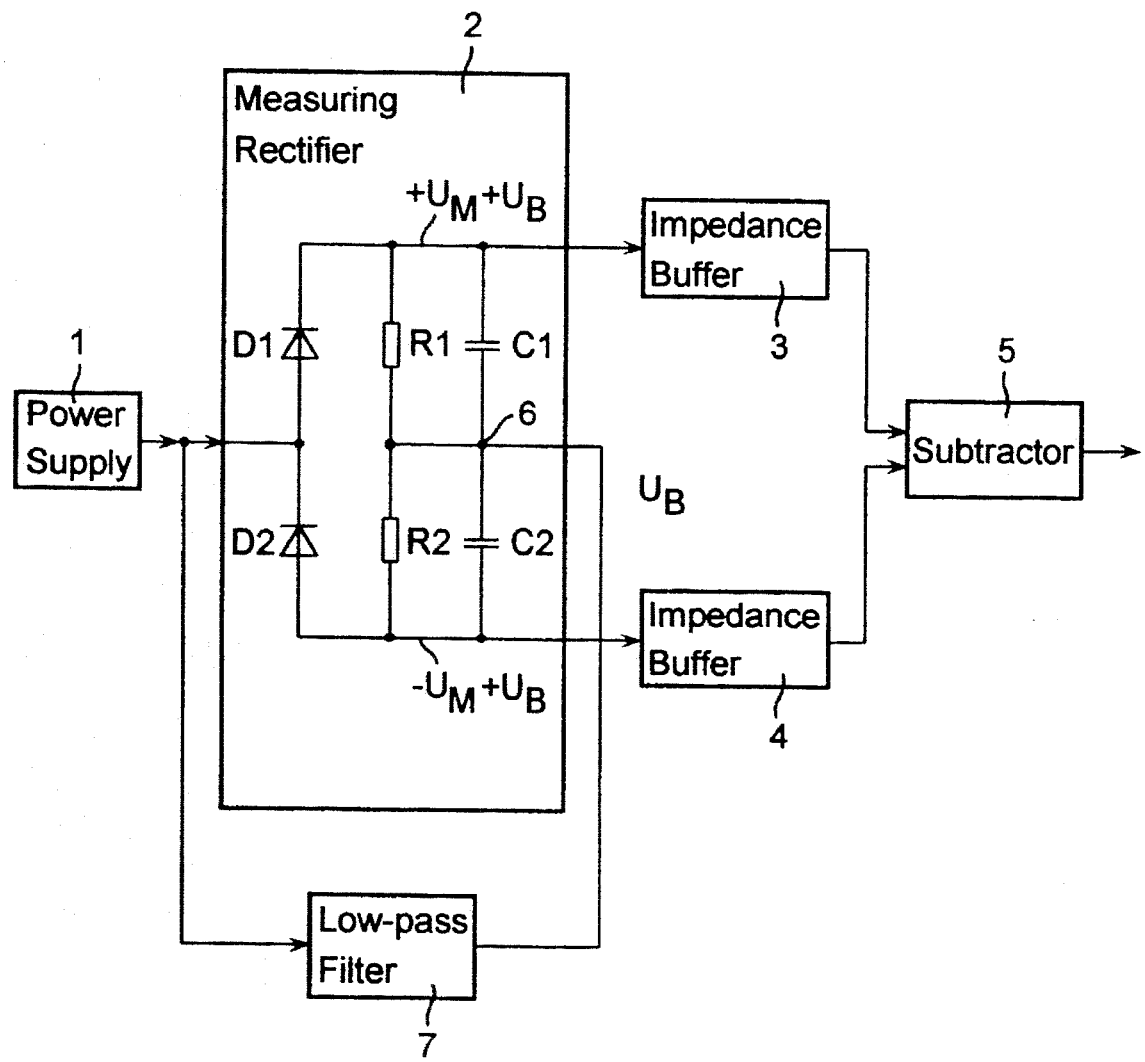

LEVEL MEASURING SET FOR LOW-FREQUENCY SIGNALS

BACKGROUND OF THE INVENTION

The present invention relates to a level measuring set for low-frequency signals with superimposed direct voltage.

The measuring time of automatic level measuring devices is basically determined by the lower threshold frequency of the measurement rectifier.

Coupling capacitors are generally used for coupling the level measuring set to low-frequency signals with superimposed direct voltage. These have a disturbing effect on the measurement time, since recharging processes occur in the coupling capacitors, caused by switching peaks, overloads, etc.

German Patent No. 38 316 678 discloses a circuit arrangement for measuring peak values of a time-variable signal superimposed on a direct voltage pulse, in which the direct voltage component is eliminated by inversion and addition of the inverted and non-inverted signal.

SUMMARY OF THE INVENTION

The present invention provides a simple level measuring set without using coupling capacitors.

The level measuring set according to an embodiment of the present invention is a level measuring set for low-frequency signals with superimposed direct voltage. The level measuring set includes a low-pass filter, a measuring rectifier and a subtractor. The low-pass filter receives a low-frequency measuring signal and outputs a reference potential which corresponds to the direct voltage. The measuring rectifier forms a positive and a negative direct voltage component with a direct voltage component superimposed on the reference potential for the positive and negative half-waves of the low-frequency measurement signal. A subtractor subtracts the components formed by the measurement rectifier to provide an output level measurement value of the low-frequency measurement signal.

The level measuring set of the present invention can also be used for drifting direct voltages.

BRIEF DESCRIPTION OF THE DRAWING

The present invention is explained below with an embodiment thereof represented in the sole drawing, which illustrates a level measuring set for low-frequency signals.

DETAILED DESCRIPTION

The sole drawing illustrates a level measuring set including a power supply 1, which may be, for example, an output amplifier. Power supply 1 gives a low-frequency measuring signal to a measuring rectifier and to a low-pass filter 7. Measuring rectifier 2 has two diodes D1 and D2, with the cathode of diode D1 connected to the anode of diode D2, as well as two resistors R1 and R2, and two capacitors C1 and C2.

The low-frequency measuring signal is applied to the connection between the two diodes D1 and D2 of the measuring rectifier 2. A positive direct voltage $+U_M$ is formed from the measuring signal by diode D1, polarized in the direction of the current flow, and a negative direct voltage $-U_M$ is formed by diode D2, polarized against the direction of the current flow. The cathode of diode D1 is connected to a reference point 6 via a shunt circuit consisting of resistor R1 and capacitor C1. The anode of diode D2 is also connected to reference point 6 via a shunt circuit consisting of resistor R2 and capacitor C2. The positive and negative direct voltages $+U_M$ and $-U_M$ are referred to the potential of reference point 6.

Reference point 6 is connected to the output of low-pass filter 7, to whose input the low-frequency measuring signal is applied. Low-pass filter 7 can be an active low-pass filter or a passive low-pass filter followed by an impedance buffer.

The low-frequency measuring signal emitted by power supply 1 contains a low-frequency alternating voltage and a superimposed positive or negative direct voltage. This direct voltage can also drift over time.

The direct voltage is filtered out of the low-frequency measuring signal by low-pass filter 7 and is used by the rectifiers (diodes D1, D2) of measuring rectifier 2 as reference point 6 with a reference potential $U_B$.

Positive component $+U_M$ of the low-frequency measuring signal, rectified by diode D1 and added to reference potential $U_B$, is applied to resistor R1 and, via an impedance buffer 3, to an input of a subtractor 5.

Negative component $-U_M$ of the low-frequency measuring signal, rectified by diode D2 and added to reference potential $U_B$, is applied to resistor R2 and, via an impedance buffer 4, to another input of subtractor 5.

Subtractor 5 forms the difference of the two applied signals as follows:

$$(+U_M+U_B)-(-U_M+U_B)=2\,U_M$$

Subtractor 5 emits this result ($2U_M$) as the level measuring value of the low-frequency measuring signal.

I claim:

1. A level measuring set for low-frequency signals with superimposed direct voltage, comprising:

a low-pass filter receiving a low-frequency measurement signal and outputting a reference potential ($U_B$); a measuring rectifier forming a positive and a negative direct voltage component with a direct voltage component ($+U_M$, $-U_M$) superimposed on the output reference potential ($U_B$) for positive and negative half-waves of the low-frequency measurement signal, with the reference potential ($U_B$) applied to a reference point of the measuring rectifier; and a subtractor receiving at inputs thereof the positive and negative direct voltage components ($+U_M$, $-U_M$) superimposed by the reference potential ($U_B$), are supplied, and outputting a level measurement value of the low-frequency measurement signal.

2. The level measuring set according to claim 1, further comprising at least one impedance buffer connected between the measuring rectifier and the subtractor, wherein the positive and negative direct voltage components ($+U_M$, $-U_M$) superimposed by the reference potential ($U_B$) are provided from the measuring rectifier to the substractor via the at least one impedance buffer.

3. The level measuring set according to claim 1, wherein the measuring rectifier comprises a plurality of diodes, a plurality of resistors, and a plurality of capacitors.

4. The level measuring set according to claim 1, further comprising a power supply providing the low-frequency measuring signal to the low-pass filter.

5. The level measuring set according to claim 4, wherein the power supply supplies the low-frequency measurement signal to the low-pass filter and to the measuring rectifier.

6. The level measuring set according to claim 4, wherein the power supply comprises an output amplifier.

7. The level measuring set according to claim 1, wherein the low-pass filter comprises at least one of an active low-pass filter and a passive low-pass filter followed by an impedance buffer.

* * * * *